United States Patent [19]

Ebert

[11] 3,925,710

[45] Dec. 9, 1975

[54] GENERAL PURPOSE ELECTRONIC INTERFACE EQUIPMENT PACKAGE

[75] Inventor: Robert H. Ebert, San Diego, Calif.

[73] Assignee: The United States of America as represented by the Secretary of the Navy, Washington, D.C.

[22] Filed: July 1, 1974

[21] Appl. No.: 484,746

[52] U.S. Cl. ...... 317/100; 317/101 DH; 174/35 GC; 312/223; 317/120; 174/16 R

[51] Int. Cl.$^2$ ........ H05K 7/14

[58] Field of Search .... 179/98; 317/99, 100, 101 R, 317/101 CB, 101 DH, 120, 122; 174/DIG. 9, 16 R, 35 GC, 35 MS; 339/17 LM, 17 M, 17 N, 32 R, 176 MP, 112 R, 75 R, 75 A, 75 M, 82; 312/DIG. 24, 7 R, 223

[56] References Cited

UNITED STATES PATENTS

| | | | |
|---|---|---|---|
| 3,147,403 | 9/1964 | Cressman | 317/100 |
| 3,188,524 | 6/1965 | Williams | 317/101 DH |
| 3,247,312 | 4/1966 | Alessi | 174/35 GC |
| 3,621,339 | 11/1971 | Hodgson | 317/100 |
| 3,634,732 | 1/1972 | Finger | 317/101 R |
| 3,755,630 | 8/1973 | Boyer | 317/120 |
| 3,771,293 | 11/1973 | Vest | 174/16 R |
| 3,800,097 | 3/1974 | Maruscak | 317/101 DH |

*Primary Examiner*—Gerald P. Tolin
*Attorney, Agent, or Firm*—R. S. Sciascia; G. J. Rubens

[57] ABSTRACT

An electronic package is provided having a wide degree of flexibility for interfacing a plurality of different and changeable modules in accordance with specific requirements for systems and equipments, old and new, that the package is to accommodate. The package is constructed with inner and outer nested chassis units with the connecting cables and module socket connections so arranged that the inner chassis can be readily removed as a package from the outer chassis through a front opening therein. The front opening in the outer chassis is closeable by a door that resiliently biases the inner chassis to a connected position, and also seals the inner chassis from radio frequency interference. A common dual bus-bar electrically interfaces a plurality of plug-in modules that may be randomly connected.

10 Claims, 7 Drawing Figures

GENERAL PURPOSE ELECTRONIC INTERFACE EQUIPMENT PACKAGE

BACKGROUND OF THE INVENTION

This invention relates to electronic equipment packaging, and more particularly to a standard, general purpose package that offers a wide degree of flexibility in interfacing a variety of existing and/or new electronic equipments without requiring a redesign of the package for each different application.

The previous packaging technique for interfacing a plurality of different functional equipment was to design a specific "black box" package for each different system application. This resulted in a proliferation of "black boxes," one for each different system, with some differing in a slight degree. With design time normally spanning from 1 to 3 years per equipment, such design significantly added to development costs.

Accordingly, for the military services this "black box" technique complicated inventory and maintenance of such equipment, and resulted in a vast amount of duplication of design effort.

Furthermore, this prior art packaging invariably employed point-to-point wiring of the various module boards contained in the equipment; which is expensive to construct, subject to frequent errors in manufacturing, and contributes to excessive down-time of the equipment.

SUMMARY OF THE INVENTION

A universal, self-contained, electronic package is provided for interfacing a plurality of different remote electronic equipments for use in a data processing system or the like. The electronic package may serve to interface a variety of functions, such as, (1) acquiring sensor inputs; (2) communication and display; (3) sensor control; (4) acquiring, checking and reformating data; (5) timing and recording; (6) error detection and correction.

The electronic package consists of an outer chassis and a nested inner chassis slidably removable through a front opening in the former. The inner chassis contains a plurality of parallel sockets slidably connecting a plurality of plug-in module cards or boards, each pertaining to an assigned function to be interfaced by the equipment. The inner chassis may contain basic plug-in module cards, such as a power module, and processor modules including logic and control modules for coordinating communication between a plurality of special module cards selected to satisfy the functional requirements of each particular installation.

Commonality is achieved between the various module cards through a common bus-bar back plane that enables intermodular control and data transfer between all of the basic and special modules that are assembled for any given installation.

A cable transition plate on the outer chassis provides structural support for the heavy weighted armored exterior cables from the remote equipment for connection to the light weight inner cables leading to the module cards in the inner chassis. The inner cables extend through ducts between the nested inner and outer chassis, and are preferably connected to the front edge of the module cards. The transition plate is preferably formed as a readily removable rear wall of the outer chassis capable of being replaced by a new tailor made plate depending on changing requirements of the systems. Suitable inlet and outlet ducts are also provided for an air cooling system. A front door to the outer chassis opening can be provided with sealing means for the ducts and RFI filters, as well as means for biasing the inner chassis and its components in their connected position.

OBJECTS OF THE INVENTION

A principal object of this invention is to provide a general purpose electronic package that can interface a wide variety of remote electronic equipments that may be required for a plurality of different system installations.

Another important object is to provide a common bus-bar plate that can interconnect a plurality of changeable module cards at random plug-in locations in the package.

Still a further object is to provide such equipment with basic plug-in power supply and logic modules that can be interfaced with a variety of special plug-in module cards.

Still another object is to provide an inner and outer chassis with the former readily removable through the front of the outer chassis for replacement and repair.

Other objects, advantages and novel features of the invention will become apparent from the following detailed description of the invention when considered in conjunction with the accompanying drawings.

DESCRIPTION OF THE PREFERRED EMBODIMENT

Figure 1:
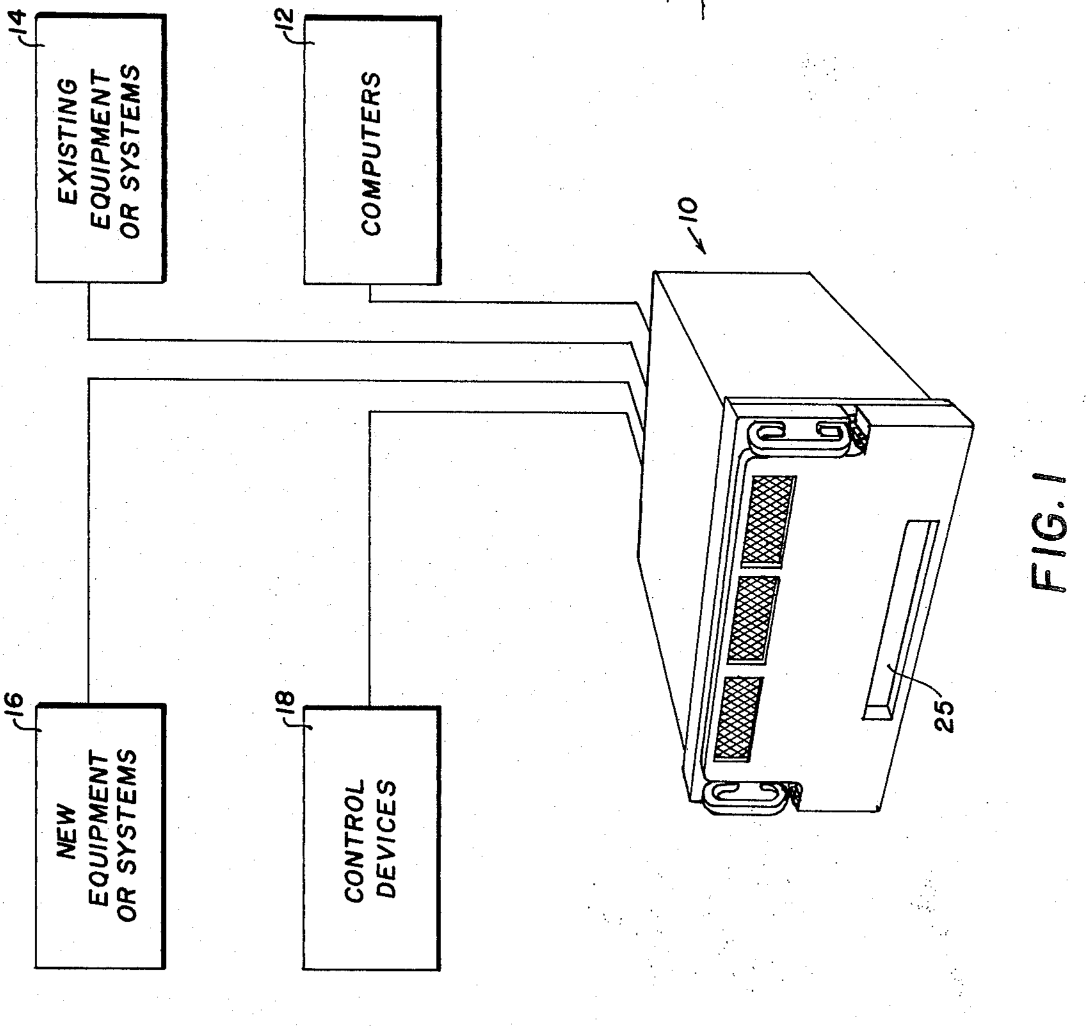
FIG. 1 is a perspective front view of the electronic equipment package shown interfacing a plurality of representative remote peripheral equipments.

Referring to the drawings where like reference numerals refer to similar parts throughout the figures, there is shown in FIG. 1 a general arrangement of an electronic equipment package 10 for interconnecting a plurality of typical peripheral equipments; such as, computers 12, existing systems or equipments 14, new systems or equipments 16, and control devices 18. It is obvious that the selection of the equipments to be interfaced by the novel electronic package 10 will depend on the specific requirements of any given electronic system.

Figure 2:
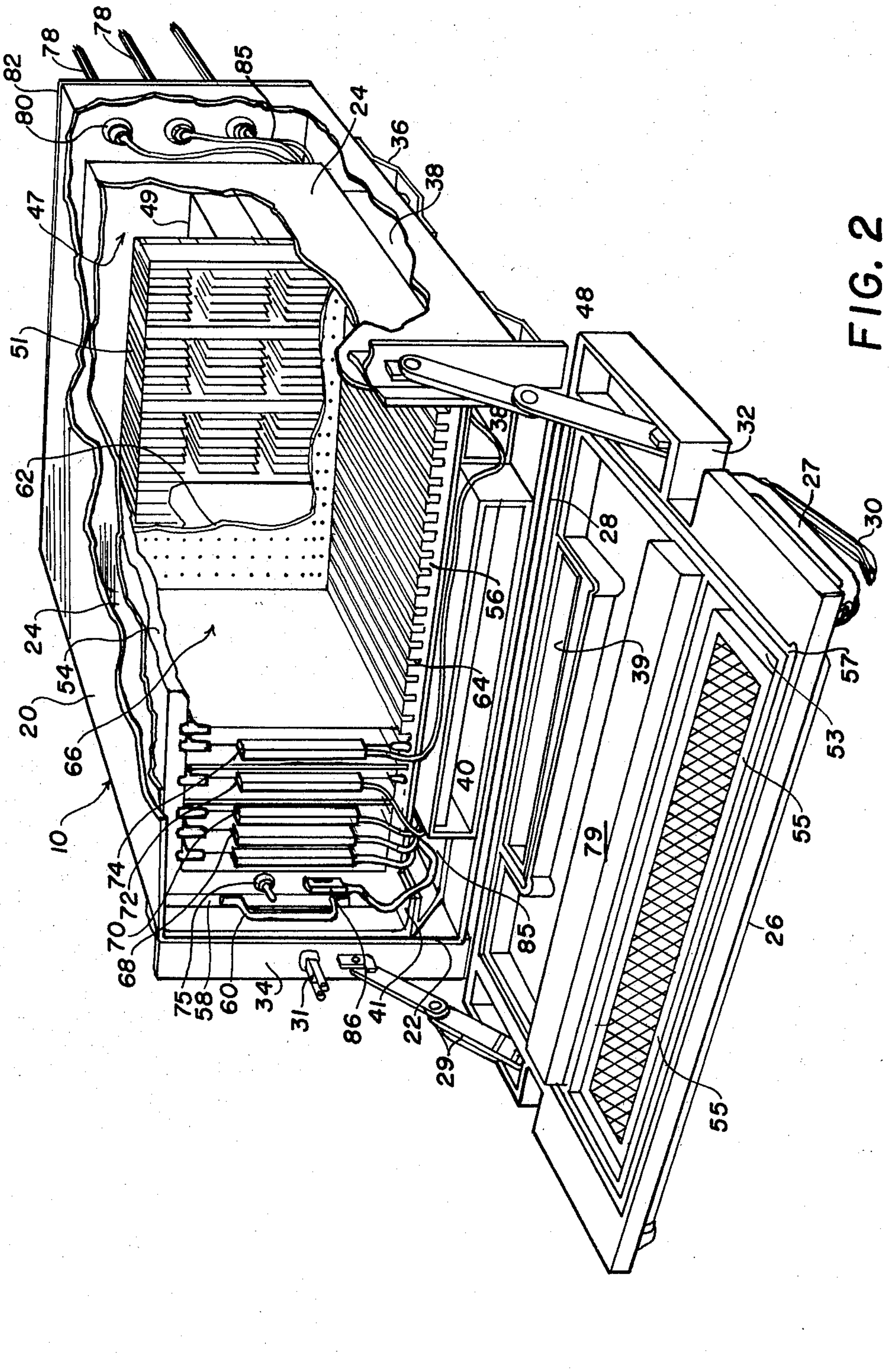
FIG. 2 is a perspective front view of the assembled electronic equipment package partially cutaway and with the front panel door open, to show the internal construction.
Figure 5:
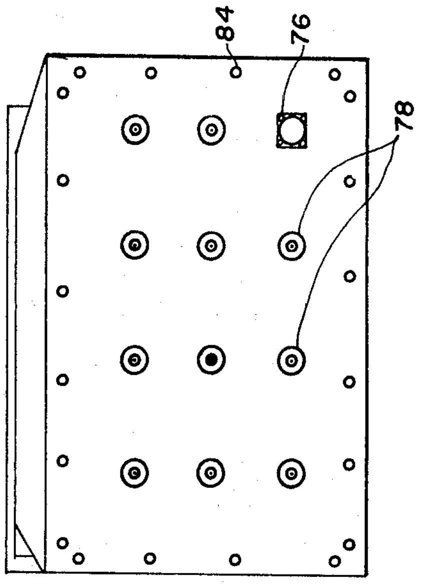
FIG. 5 is a rear elevation view of the transition plate showing the connectors for mounting the exterior cables to the package.

The detailed construction of electronic equipment package 10 is best seen in FIG. 2, and comprises an outer chassis 20 having a front opening 22 through which is removably nested an inner chassis 24. A front panel door 26 having side handles 27 is hinged at its bottom edge 28 to the outer chassis, being limited to a horizontal open position by a pair of hinged links 29. Door 26 is releasably secured in a closed position by a latch 30 pivotally associated with each handle 27 and engageable with an interlock 31 mounted on the front face of the outer chassis and adapted to project through a cut out portion 32 in the sides of the panel door.

Figure 4:
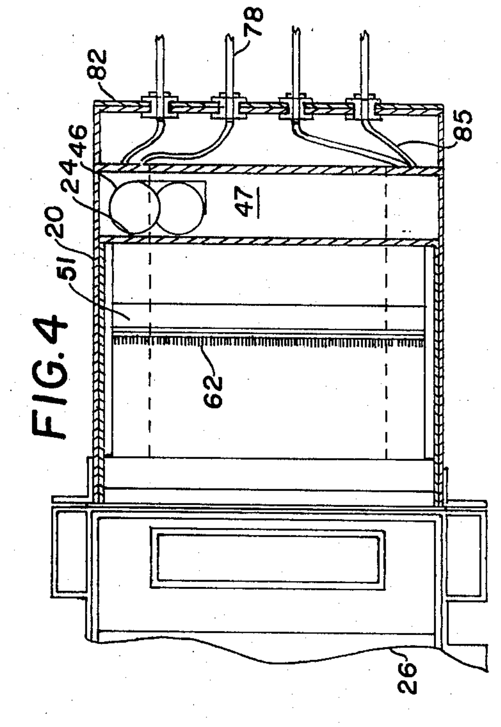
FIG. 4 is a top plan view of the electronic equipment package with the top walls of the inner and outer chassis removed.
Figure 3:
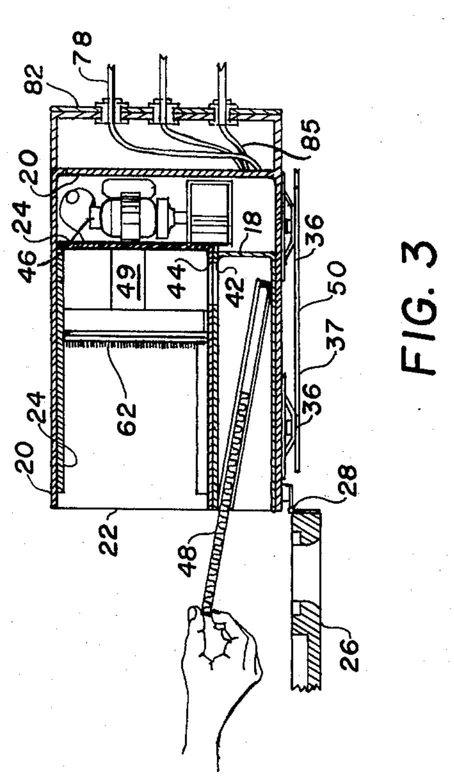
FIG. 3 is a partial cross-sectional view of the lower inner and outer chassis showing the details of the air cooling system.

Brackets 34 on each side of the outer chassis are provided for mounting to cabinet uprights (not shown), and brackets 36 are provided on the bottom of the outer chassis for mounting to a table or cabinet shelf 37 (FIG. 3).

Inner chassis 24 is slidably supported within outer chassis 20 on a plurality of ducts; side ducts 38 being provided for the internal wiring, as will be described later, and a central air inlet duct 40. Screws 41 secure the nested inner chassis to ducts 38. Duct 40 extends forward to sealably contact an air inlet opening 39 in panel door 26. As shown in FIG. 3, the aft end of air inlet duct is provided with an outlet 42 coextensive with an opening 44 in the bottom of inner chassis to a blower assembly 46 disposed in the space 47 between the rear of the inner and outer chassis. Space 47 also houses a power supply 49 and heat sink 51. Blower 46 circulates the air from air inlet 40 through the heat sink 51 between the inner and outer chassis and exhausts the air from vent 53 in front panel 26. Both exhaust vent 53 and air inlet opening 39 are covered with a suitable radio frequency interference filter material 55, and the openings sealed with an RF1 sealing strip 57. An air filter 48 is angularly disposed in duct 40 by guides 50, being easily replacable through the front outer chassis opening 22, as illustrated.

Inner chassis 24 houses the heart of the electronic package, and includes a module assembly cage 52 comprising upper and lower walls 54 and 56, respectively, maintained in spaced relation by front posts 58 having handles 60, and by a rearward parallel bus-bar back plane 62, later to be described in detail.

Upper and lower cage assembly walls 54 and 56 are formed with inwardly opposing slots 64 to receive slidably therebetween one of a plurality of selected respective plug-in module boards 66. As illustrated in FIG. 2, module cage assembly 52 contains 31 plug-in module slot sets to accommodate the following described modules.

One of the novel features providing the interface equipment with a general purpose, is the provision of combining basic plug-in modules with at least one special purpose modules, the selection of the later depending on the specific configuration for any particular system. The basic modules for the specific embodiment comprises a monitor module 68, a control module 70, an arithmetic module 72, and a memory module 74, all four modules collectively forming a processor unit. An encapsulated power supply module 76 having an on-off switch 75 provides the required DC power to the processor modules. Three of the 31 card slot rows are dedicated to the power supply module. Additional power supplies can be provided to supplement the power demands where additional special purpose modules are utilized.

Monitor module 68 allows an operator at a remote teletypewriter or other input/output (I/O) device to exercise complete control through the interface and system control. By using the monitor and special purpose modules, the operator can cause the system to run, stop, or trace; to dump or load memory; and to set the trace condition and report trace results. While performing these functions, the operator can automatically obtain a print out to record his own actions, and the responses from the interface equipment. Control module 70 coordinates the automatic sequencing within the interface equipment. Arithmetic module 72, in addition to normal arithmetic functions, offers a complete complement of logical operations upon data and facilitates data manipulation of the type required in general interfacing applications. Memory module 74 contains random access memory logic and holds 2,048 16-bit words. Memory can be expanded in 2K nominal increments by the addition of more memory modules.

A resilient pad 79 is secured to the inside wall of panel door 26, and when the door is closed biases the module boards and connectors in their connected position.

Electrical input from the peripheral equipments to interface equipment 10 is provided by external AC primary power cable 77 and one or more I/O cables 78 attached by connectors 80 on a transition plate 82 detachably secured by screws 84 to the outer chassis 20 and forming the rear wall thereof. The number of I/O cables will depend on the number and types of peripheral equipment being interfaced, and, therefore, whenever the cable requirements change materially, a new transition plate can be readily substituted.

As the external I/O cables are normally large and heavy, being of armored type and used on shipboard installations, the transition plate is fabricated of heavy stock to provide the necessary support therefor, avoiding any stress on internal cables 85. The internal cables extend from connectors 80 through cable ducts 38 and are detachably secured by connectors 86 to the front of each plug-in module board 66. This feature of accessibility is an important consideration in that it enables inner chassis 24 to be pulled out of the outer chassis merely by disconnecting the internal cables at connectors 86.

Figure 6:
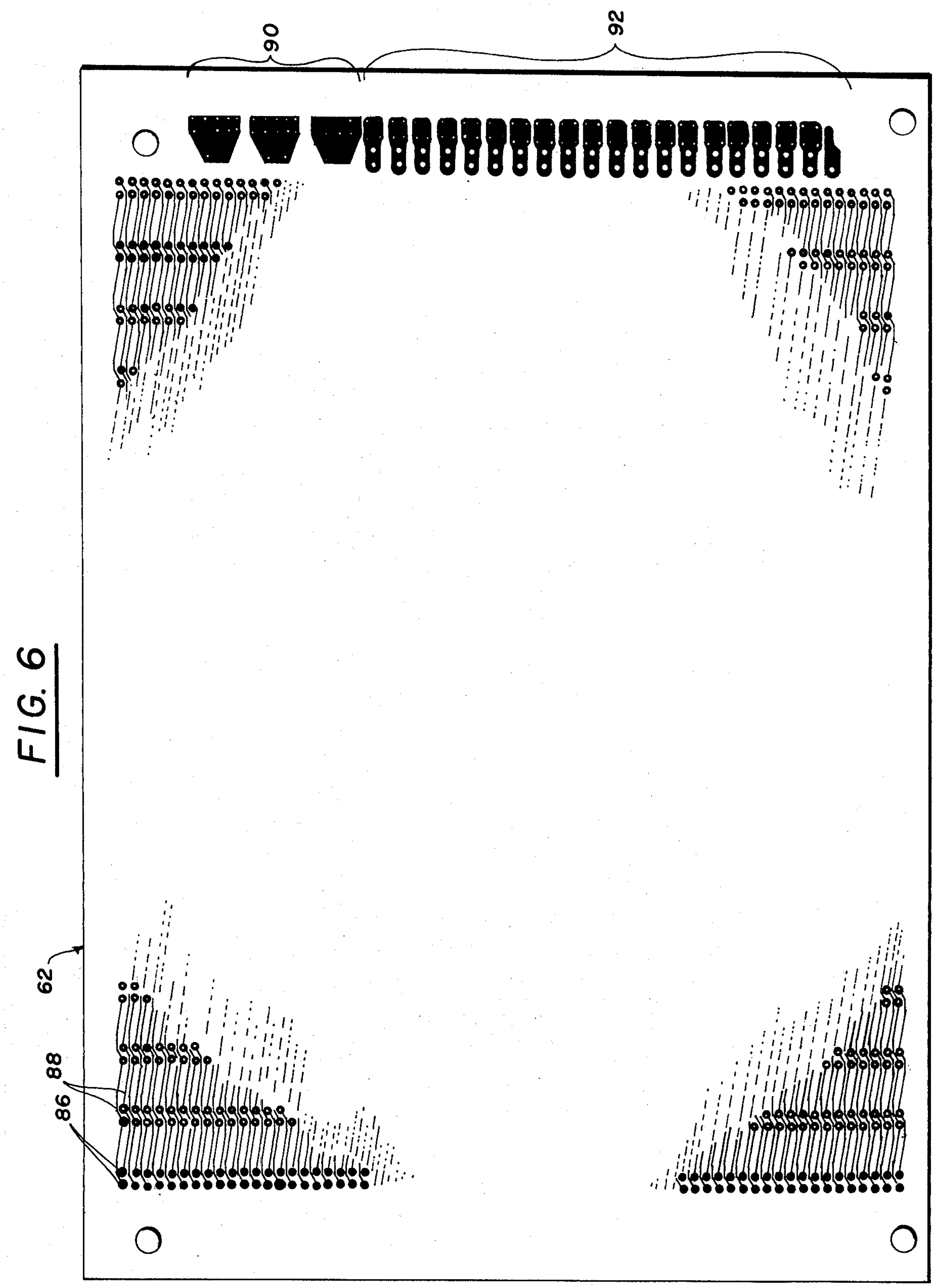
FIG. 6 is a rear elevation view of the common bus-bar plate.

One of the novel features of the invention is the use of the dual parallel bus-bar back plane 62 (FIG. 6) which is utilized to interconnect the various plug-in modules wherever they are inserted in cage 52. As previously described, back plane 62 contains 31 dual rows of connector pins 86. Of these, 28 rows are available for logic plug-in modules 66, and three are dedicated to power module 76. Each dual row contains 140 pins. The busses 88 are formed by connecting together the corresponding dual pins to each row forming in effect upper and lower busses between the dual pins. As there are 140 pins in each dual row, they provide 140 separate busses in the back plane. Thus, because of this parallel bus structure afforded by back plane 62, the logic modules need not be dedicated to specific plug-in slots, and therefore they can be plugged in at random slots.

Certain busses are duplicated to allow automatic switching of spare modules from an active state (online) to an inactive state (offline). This arrangement allows an operator to perform certain basic functions to offline modules while other modules in the equipment are operating online.

Figure 7:
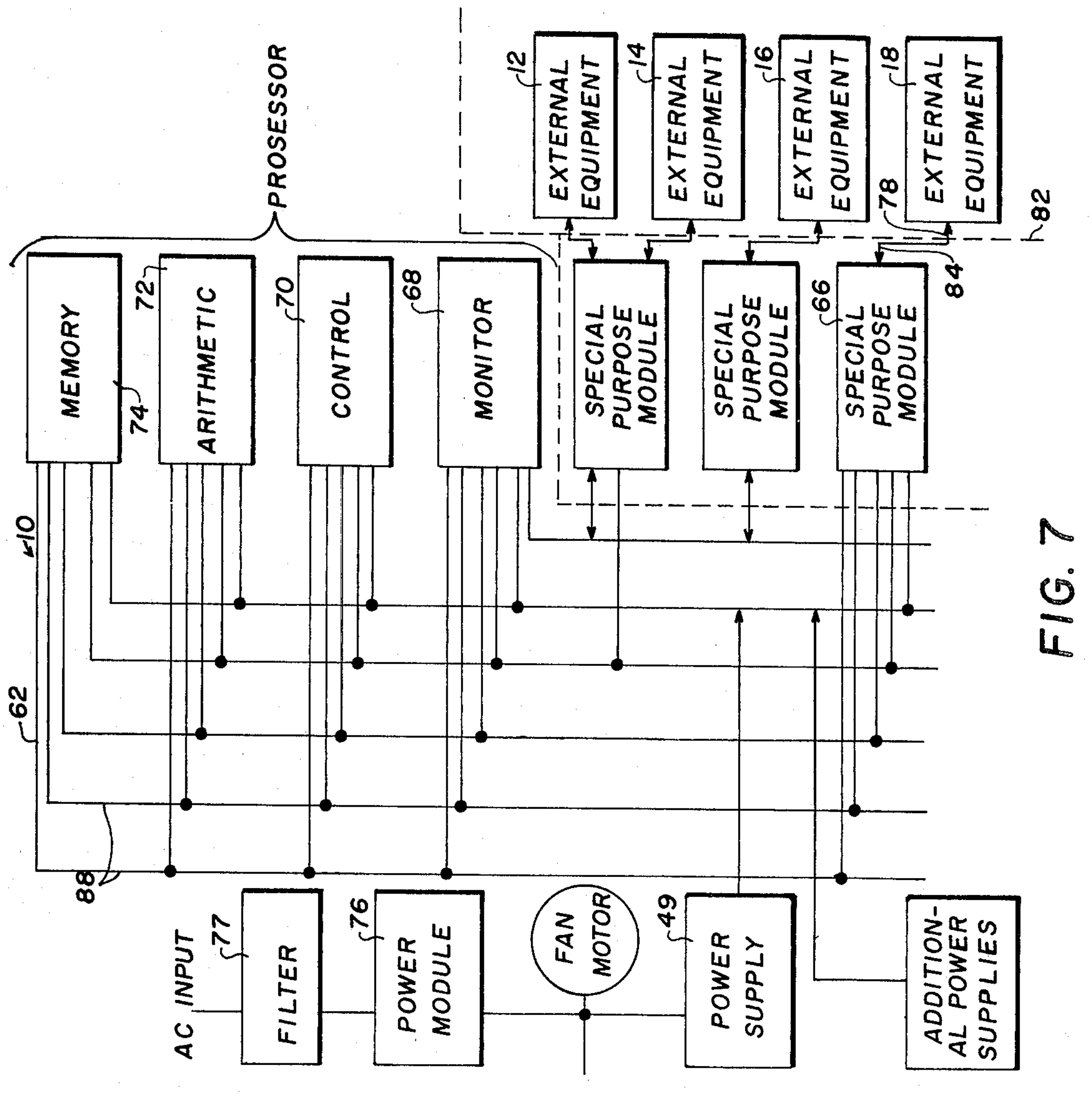
FIG. 7 is a functional circuit diagram of the equipment in FIG. 1.

The manner in which information coordination is accomplished through common busses 88 of the back plane will be described with reference to the overall functional block diagram of the interface equipment in FIG. 7. Because the interface equipment 10 can be used in a variety of different applications, the specific procedure depend on the particular equipment with any given system. An operator can communicate with interface equipment 10 using external equipment, such as tape units, keyboards, tape readers, voice input devices, and other peripheral equipment. Commands entering into the equipment cause data to be exchanged between the various plug-in modules 66 and the external equipment via parallel bus-bar back plane 62. Since the ultimate configuration of interface equipment 10 is variable, methods of communication and the operator's relationship therewith also vary. Since the specific electronic operation of the interface equipment 10 forms no part of this invention, a detailed description is unnecessary.

The AC power input pins are designated at 90, and the DC power input pins at 92. A fail-safe feature of this design resides in that the AC power is not made parallel being controlled by power module 76. Thus, these pins are not accessible to operating personnel without first disconnecting the circuit by removing the power module from cage 52.

The novel interface equipment is designed to enhance overall system reliability and to minimize maintenance and trouble shooting down-time. For example, the inner chassis 24 containing the electronic circuitry can be readily removed from outer chassis 20 through front opening 22 by merely disconnecting the inner cable connectors 80 at the front edge of each of the module boards 66. The logic module boards can be inserted in any of the 31 module slots in the cage, and the data transfer among the modules is coordinated by parallel bus-bar back plane 62 in which all of the modules are detachably plugged in. The bus-bar back plane 62 is the only electrical connection between the modules and the module cage. This commonality provided by the bus-bar back plane is the basis for the overall flexibility in the interface equipment. A twin bus technique in the back plane bus-bar enables the operator to perform certain functions to offline modules while other modules are operating online. Another important contribution by the invention is that all outer cables, as well as the inner cables leading to the modules, are mechanically supported by a sturdy transition plate. The transition plate, which forms the rear wall of the outer chassis, is readily replaceable to accommodate a different cable arrangement caused by changes in system configuration. Another consideration especially desirable in military applications where shock and vibration are involved, is the biasing means on the front door which maintains the modules and their inner cable connections electrically secured in place.

Obviously many modifications and variations of the present invention are possible in the light of the above teachings. It is therefore to be understood that within the scope of the appended claims the invention may be practiced otherwise than as specifically described.

What is claimed is:

1. General purpose electronic interface equipment package for interconnecting a variety of different functions comprising:

an outer chassis having a front opening and a door therefore;

an inner chassis compactly nested within said outer chassis and removable through said front opening;

a row of parallel sockets in the inner chassis for receiving individually a plurality of basic plug-in modules, and of special readily changeable plug-in modules depending on the specific requirements of a given system;

a bus-bar plate mounted in the rear of said inner chassis perpendicular to said sockets having a plurality of connectors for electrically interfacing a selected number of said modules;

a transition plate forming an outer wall of said outer chassis and having a plurality of electrical connectors interconnecting and supporting a plurality of outside and inside cables; and said inner cables positioned between said outer and inner chassis, and extending from the connectors on the transition plate and capable of being connected to separable connectors on the front end of the plug-in modules;

whereby the inner chassis can be readily removed through the front opening merely by disconnecting the connectors in the front of said plug-in modules.

2. The electronic package of claim 1 wherein basic and special modules are inserted into said sockets and connected to said cables.

3. The electronic package of claim 1 wherein said transition plate is detachably mounted as a rear wall to said outer chassis and replaceable depending on the functions to be accommodated by the package.

4. The electronic package of claim 2 wherein each of said modules have a connector mounted on their front surface connected to said cables and being accessible through said opening in the outer chassis when the door is in an open position.

5. The electronic package of claim 1 wherein an air cooling duct is positioned between said chassis, and said door has an air inlet opening leading to the air cooling duct and an air outlet opening, said outlet opening having a radio frequency interference filter said door being the only door to the outer chassis and being substantially the same size as the front face thereof.

6. The electronic package of claim 1 wherein means are provided for supporting the door in a horizontal position when opened to provide a temporary support during the removal of any equipment from the outer chassis.

7. The electronic package of claim 2 wherein said bus-bar plate has mounted a plurality of power connections so that distribution between the basic plug-in modules and the special changeable plug-in modules may be determined by one of the modules.

8. The electronic package of claim 5 wherein ducts are provided between the inner and outer chassis to accommodate the inside cables extending from the transition plate to the front ends of the modules, said air cooling duct supporting therein a filter replaceable through said front opening with the door in an open position.

9. The electronic package of claim 1 wherein said bus-bar plate has a plurality of rows of connectors, each row having at least a dual line of connectors, the corresponding connectors in each line being connected together by a common bus line extending between the rows enhancing system reliability.

10. The electronic package of claim 2 wherein one of the basic plug-in modules includes a power module which controls the power distribution through said bus-bar plate.

* * * * *